(12) United States Patent
Huang et al.

(10) Patent No.: US 7,183,608 B2
(45) Date of Patent: Feb. 27, 2007

(54) MEMORY ARRAY INCLUDING ISOLATION BETWEEN MEMORY CELL AND DUMMY CELL PORTIONS

(75) Inventors: Lan-Ting Huang, Hsin-Chu (TW); Chen-Chin Liu, Hsin-Chu (TW); Cheng Jye Liu, Jhongli (TW)

(73) Assignee: Macronix International Co., Ltd., Hsinchu (TW)

( * ) Notice: Subject to any disclaimer, the term of this patent is extended or adjusted under 35 U.S.C. 154(b) by 98 days.

(21) Appl. No.: 11/137,476

(22) Filed: May 26, 2005

(65) Prior Publication Data

US 2006/0267079 A1 Nov. 30, 2006

(51) Int. Cl.
*H01L 29/792* (2006.01)

(52) U.S. Cl. ............... 257/324; 257/411; 257/506; 257/E29.309

(58) Field of Classification Search ............ 257/324
See application file for complete search history.

(56) References Cited

U.S. PATENT DOCUMENTS 6,787,860 B1 9/2004 Huang et al.
2004/0206996 A1* 10/2004 Lee et al. .................. 257/296

* cited by examiner

*Primary Examiner*—Tu-Tu Ho
(74) *Attorney, Agent, or Firm*—Finnegan, Henderson, Farabow, Garrett & Dunner, L.L.P.

(57) ABSTRACT

A semiconductor memory device structure includes an isolation region formed along an edge of a memory cell portion adjacent to a dummy cell portion to isolate the memory cell portion from leakage current generated in the dummy cell portion.

22 Claims, 4 Drawing Sheets

MEMORY ARRAY INCLUDING ISOLATION BETWEEN MEMORY CELL AND DUMMY CELL PORTIONS

TECHNICAL FIELD

The present invention generally relates to an array boundary structure for a memory device. More particularly, this invention relates to a boundary layout structure to prevent over-erase stress in a memory device.

DESCRIPTION OF THE RELATED ART

Non-volatile memory devices are extensively used for storing information. Unlike volatile memory, non-volatile memory is able to retain stored information in the absence of a constant power source. Examples of such devices include read-only memory (ROM), programmable ROM (PROM), erasable PROM (EPROM), electrically erasable programmable ROM (EEPROM), and flash EEPROM, which is typically referred to as flash memory.

Memory devices are generally composed of arrays of memory cells. A conventional nonvolatile read only memory (N-bit) cell includes a substrate having a source region spaced-apart from a drain region, and a channel region therebetween. The N-bit cell also includes a charge trapping structure ("ONO"—oxide-nitride-oxide) formed over the channel region and portions of the source and drain regions. The ONO structure includes a first dielectric layer formed over the substrate, a charge trapping layer formed over the first dielectric layer, and a second dielectric layer formed over the charge trapping layer. The N-bit cell further includes a gate structure formed over the second dielectric layer, and sidewall spacers formed contiguous with at least the gate structure. The charge trapping layer "stores" electrical charges by trapping electrons therein, and the thickness of the first and second dielectric layers should be sufficient to prevent leakage, i.e., direct tunneling of stored electrons under normal operating conditions. The N-bit cell may be programmed by appropriately biasing the gate, the source, and the drain such that charge carriers (electrons or holes) are forced to tunnel or be injected into the trapping layer, effectively trapping the carriers. Applying different biases to the gate, the drain, and the source allows the memory cell to be read or erased.

Multiple memory cells, including N-bit cells such as described above, may form a memory array of a memory device, which generally includes the memory cells coupled to a grid of word lines and bit lines. The source and drain regions described above may serve as bit lines, over which bit line dielectric regions are formed.

Conventionally, the dummy bit line at the edge of the device is continuously coupled to ground. Thus, regardless of the voltage applied to a corresponding bit line (whether a program or erase voltage), the dummy cell is in a constant state of being weakly erased, which leads to over-erasure of the dummy cell in certain situations. In addition, the state of the dummy cells may result in bit line to bit line current leakage both in the dummy cells and the memory cells during read operations of the memory cells.

Conventional arrays of memory cells can suffer from over-erase stress in memory cells associated with the last bit line in an array adjacent to the first dummy bit line. FIG. 1 illustrates a partial plan view diagram of a conventional N-bit array 100. Conventional N-bit array 100 includes a substrate 110 in which a bit line source region 120 and a bit line drain region 130 are formed. A channel region 150 exists between bit line source region 120 and bit line drain region 130. Dummy bit lines 140 are formed in a dummy array portion of the N-bit array. Word lines and ONO structures are not shown.

FIG. 2 illustrates a partial cross-sectional view of conventional N-bit array 100 viewed along section II—II shown in FIG. 1. Conventional N-bit array 100 includes substrate 110 in which bit line source region 120 and bit line drain region 130 are formed in the memory cell array. A dummy bit line source region 210 and a dummy bit line drain region 220 are formed in the dummy array portion of N-bit array 100. Bit line dielectric regions 235 are formed over bit line regions 120, 130, 210, 220. An ONO structure 240 is formed between bit line dielectric regions 235 and includes a first dielectric layer 245, a charge trapping layer 250, and a second dielectric layer 255. Channel region 150 is formed underneath ONO stacked structure 240. This conventional structure is susceptible to over-erase stress in a region 290 between the last bit line in an array and the first dummy bit line. Word lines are not shown.

Therefore, there is a need to provide an improved boundary array structure for memory cells that prevents over-erase stress in memory cells along the boundary with the dummy cell array portion during read/write cycling.

The present invention is directed to overcome one or more of the problems of the related art.

SUMMARY OF THE INVENTION

In accordance with the purpose of the invention as embodied and broadly described, there is provided a semiconductor device, comprising a semiconductor substrate including a memory cell portion and an adjacent dummy cell portion; a plurality of bit lines in the semiconductor substrate; a plurality of bit line dielectric regions formed over the plurality of bit lines; a plurality of memory cell dielectric regions provided over the semiconductor substrate in the memory cell portion and between the bit lines therein; wherein the dielectric regions comprise a stacked structure of a first dielectric layer, a charge trapping layer, and a second dielectric layer; a plurality of dummy cell dielectric regions provided over the semiconductor substrate in the dummy cell portion and between the bit lines therein; and an isolation region formed along an edge of the memory cell portion adjacent to the dummy cell region.

In accordance with the present invention, there is also provided a semiconductor device, comprising: a semiconductor substrate including a memory cell portion, an adjacent dummy cell portion, and a periphery portion; a plurality of bit lines in the semiconductor substrate; a plurality of bit line dielectric regions formed over the plurality of bit lines; a plurality of memory cell dielectric regions provided over the semiconductor substrate in the memory cell portion and between the bit lines therein; wherein the dielectric regions comprise a stacked structure of a first dielectric layer, a charge trapping layer, and a second dielectric layer; a plurality of dummy cell dielectric regions provided over the semiconductor substrate in the dummy cell portion and between the bit lines therein; an isolation region formed along an edge of the memory cell portion adjacent to the dummy cell portion; and a periphery portion adjacent to the dummy cell.

Additional features and advantages of the invention will be set forth in the description that follows, being apparent from the description or learned by practice of the invention. The objectives and other advantages of the invention will be realized and attained by the semiconductor device structures particularly pointed out in the written description and claims, as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention.

In the drawings.

DESCRIPTION OF THE EMBODIMENTS

Reference will now be made in detail to embodiments of the present invention, examples of which are illustrated in the accompanying drawings. Wherever possible, the same or similar reference numbers will be used throughout the drawings to refer to the same or like parts.

Embodiments consistent with the present invention comprise a semiconductor device memory structure that is not susceptible to over erase stress. The present invention is applicable to increasing memory device capacity and performance integrated in one package, such as in memory card technology, for example.

To overcome problems associated with the related art discussed above and consistent with an aspect of the present invention, package structures consistent with the present invention will next be described with reference to FIGS. 3 and 4.

Figure 1:
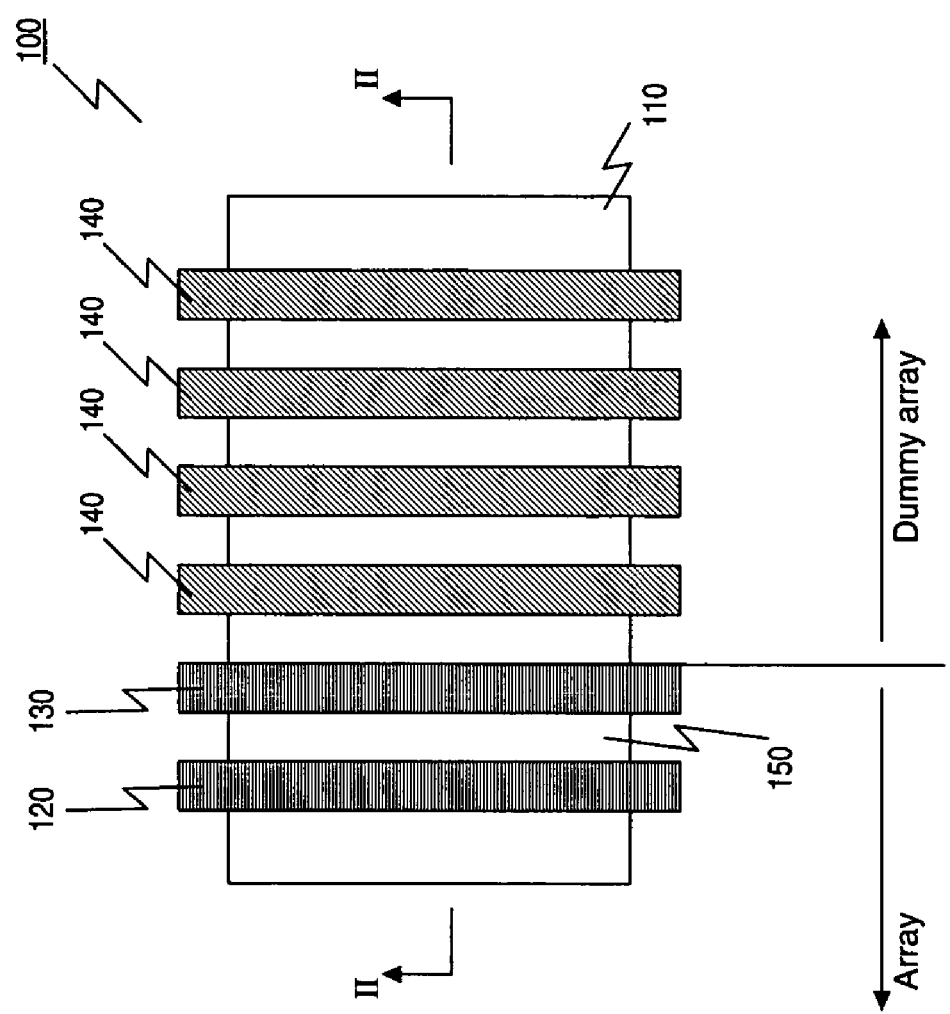
FIG. 1 illustrates a partial plan view diagram of a conventional N-bit array.
Figure 2:
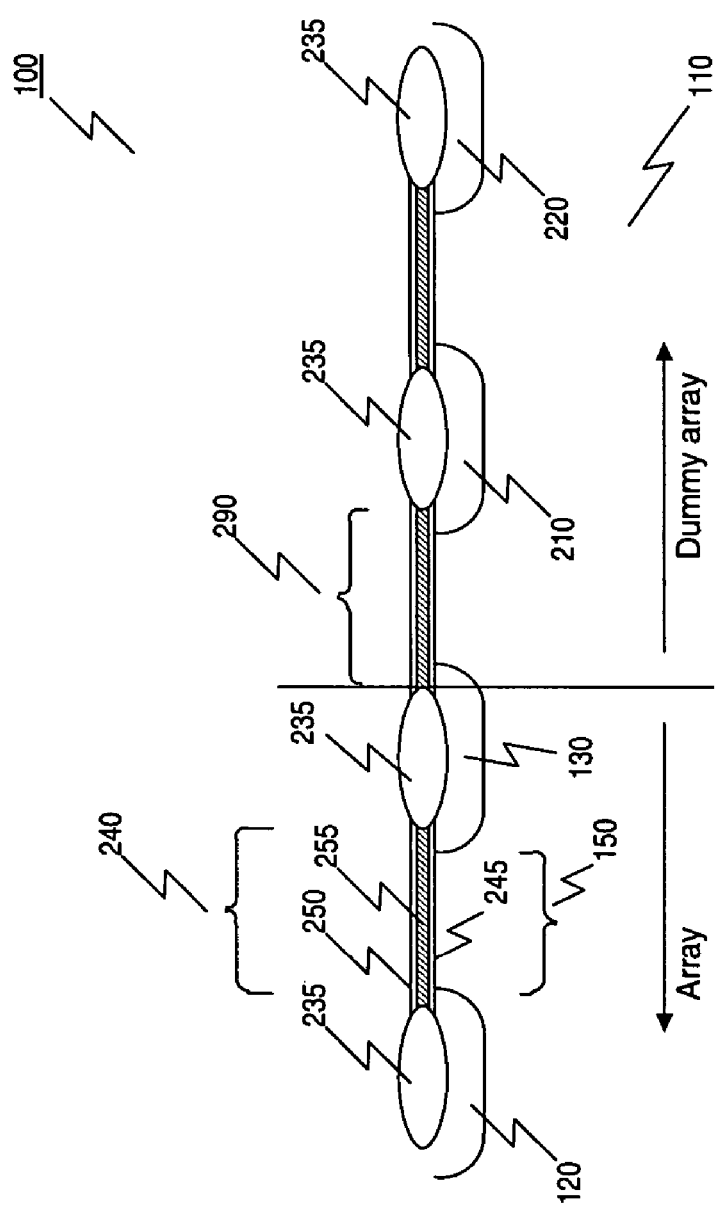
FIG. 2 illustrates a partial cross-sectional view along section II—II of the conventional N-bit array shown in FIG. 1.
Figure 3:
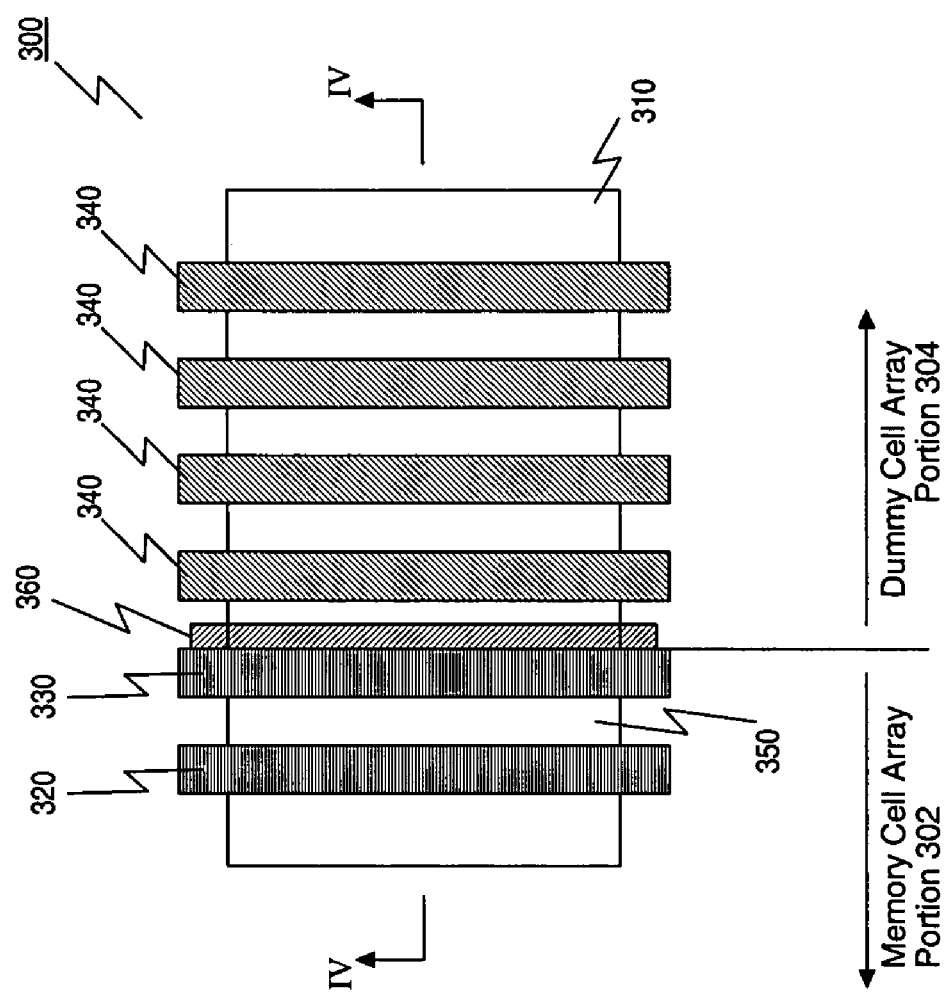
FIG. 3 illustrates a partial plan view diagram of an N-bit array consistent with an embodiment of the present invention.

FIG. 3 illustrates a partial plan view diagram of an N-bit array 300 consistent with the present invention. N-bit array 300 includes a memory cell array portion 302 and a dummy cell array portion 304 contiguous with array portion 302. N-bit array 300 includes a substrate 310. A bit line source region 320 and a bit line drain region 330 are formed in substrate 310 within memory cell array portion 302. A channel region 350 exists between bit line source region 320 and bit line drain region 330. Dummy bit lines 340 are formed in dummy cell array portion 304 of N-bit array 300. Word lines and ONO structures are not shown.

Still referring to FIG. 3, an isolation oxide region 360 is formed along the edge of memory cell array portion 302 that is contiguous with dummy cell array portion 304. Isolation region 360 may be a field-oxide (FOX) region, or a shallow trench isolation (STI) region. Isolation region 360 serves as a virtual ground structure to isolate portion 302 from portion 304.

Figure 4:
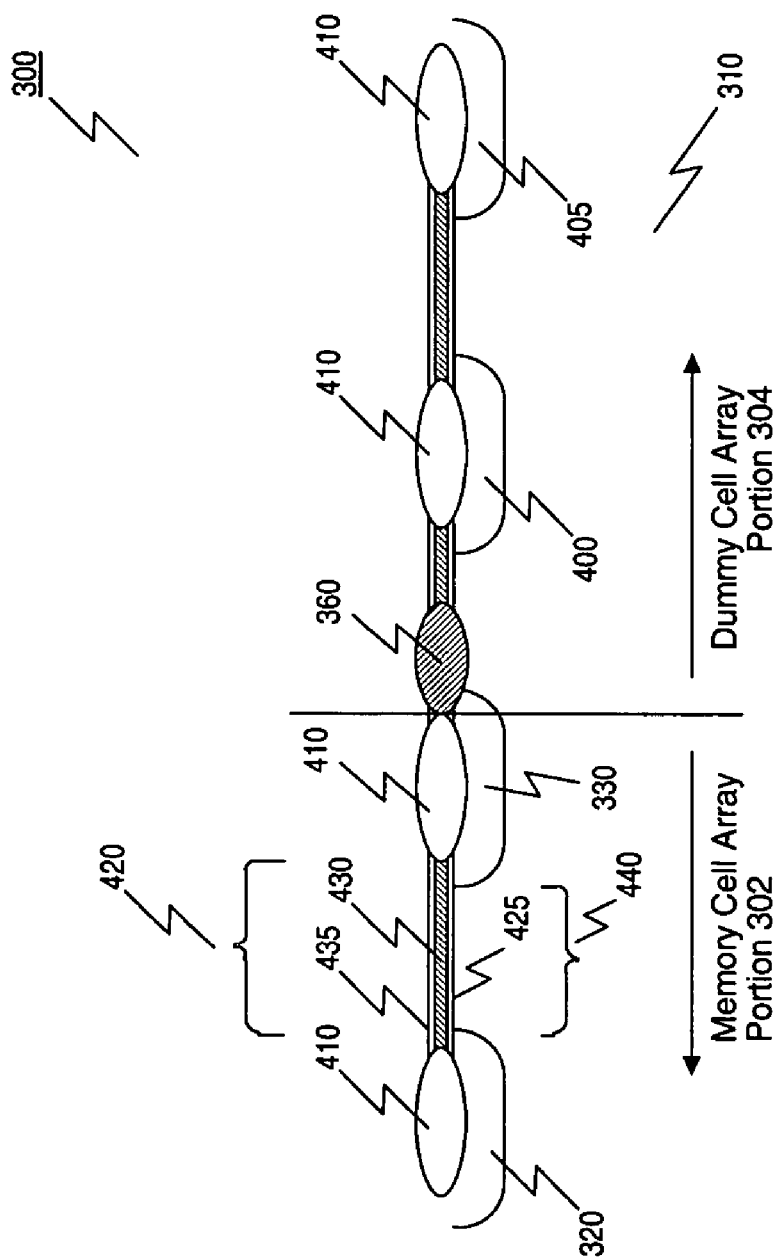
FIG. 4 illustrates a partial cross-sectional view along section IV—IV of the N-bit array shown in FIG. 3.

FIG. 4 illustrates a partial cross-sectional view of N-bit array 300 viewed along section IV—IV shown in FIG. 3. A dummy bit line source region 400 and a dummy bit line drain region 405 are formed in dummy cell array portion 304 of N-bit array 300. Bit line dielectric regions 410 are formed over bit line regions 320, 330, 400, and 405. An ONO structure 420 is formed between bit line regions 410 and includes a first dielectric layer 425, a charge trapping layer 430, and a second dielectric layer 435. A channel region 440 is formed underneath ONO structure 440. Word lines are not shown.

Still referring to FIG. 4, isolation oxide region 360 is shown in cross section, formed along the edge of memory cell array portion 302 contiguous with dummy cell array portion 304. Isolation region 360 may have a width in a range of about 0.15 µm to about 1.5 µm and a thickness in a range of about 2000 Å to about 6000 Å, and be located partially buried or completely buried in substrate 310.

Therefore, embodiments consistent with the present invention provide a new memory array layout structure that includes a virtual ground structure to isolate from each other the memory cell array portion and dummy cell array portion of an N-bit memory structure. The virtual ground structure overcomes problems of over-erase susceptibility in conventional N-bit memory cell array structures by isolating the memory cell array portion from leakage current generated in the dummy array cell portion. Also, practice of embodiments consistent with the present invention does not require new processing technology, does not require modification of convention N-bit cells, and is fully compatible with conventional N-bit memory fabrication.

It will be apparent to those skilled in the art that various modifications and variations can be made in the disclosed structures and methods without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
   a semiconductor substrate including a memory cell portion and an adjacent dummy cell portion;
   a plurality of bit lines in the semiconductor substrate;
   a plurality of bit line dielectric regions formed over the plurality of bit lines;
   a plurality of memory cell dielectric regions provided over the semiconductor substrate in the memory cell portion and between the bit lines therein;
      wherein the memory cell dielectric regions comprise a stacked structure of a first dielectric layer, a charge trapping layer, and a second dielectric layer;
   a plurality of dummy cell dielectric regions provided over the semiconductor substrate in the dummy cell portion and between the bit lines therein; and
   an isolation region formed along an edge of the memory cell portion adjacent to the dummy cell portion.

2. The semiconductor device according to claim 1, wherein the plurality of bit lines are buried $N^+$ doped regions.

3. The semiconductor device according to claim 1, wherein the plurality of bit line dielectric regions are formed of silicon oxide.

4. The semiconductor device according to claim 1, wherein the first dielectric layer and the second dielectric layers are formed of silicon oxide.

5. The semiconductor device according to claim 1, wherein the charge trapping layer is composed of $Si_3N_4$.

6. The semiconductor device according to claim 1, wherein the dummy cell dielectric regions have a thickness substantially equal to a thickness of the memory cell dielectric regions.

7. The semiconductor device according to claim 1, wherein the isolation region is a field-oxide region.

8. The semiconductor device according to claim 1, wherein the isolation region is a shallow trench isolation region.

9. The semiconductor device according to claim 1, wherein the isolation region is at least 2000 Å thick.

10. The semiconductor device according to claim 1, wherein the isolation region is at least 0.15 µm wide.

11. The semiconductor device of claim 1, wherein the dummy cell portion is contiguous with the memory cell portion.

12. A semiconductor device, comprising:
  a semiconductor substrate including a memory cell portion, an adjacent dummy cell portion, and a periphery portion;
  a plurality of bit lines in the semiconductor substrate;
  a plurality of bit line dielectric regions formed over the plurality of bit lines;
  a plurality of memory cell dielectric regions provided over the semiconductor substrate in the memory cell portion and between the bit lines therein;
    wherein the memory cell dielectric regions comprise a stacked structure of a first dielectric layer, a charge trapping layer, and a second dielectric layer;
  a plurality of dummy cell dielectric regions provided over the semiconductor substrate in the dummy cell portion and between the bit lines therein;
  an isolation region formed along an edge of the memory cell portion adjacent to the dummy cell portion; and
  a periphery portion adjacent to the dummy cell.

13. The semiconductor device according to claim 12, wherein the plurality of bit lines are buried $N^+$ doped regions.

14. The semiconductor device according to claim 12, wherein the plurality of bit line dielectric regions are formed of silicon oxide.

15. The semiconductor device according to claim 12, wherein the first dielectric layer and the second dielectric layers are formed of silicon oxide.

16. The semiconductor device according to claim 12, wherein the charge trapping layer is composed of $Si_3N_4$.

17. The semiconductor device according to claim 12, wherein the dummy cell dielectric regions have a thickness substantially equal to a thickness of the memory cell dielectric regions.

18. The semiconductor device according to claim 12, wherein the isolation region is a field-oxide region.

19. The semiconductor device according to claim 12, wherein the isolation region is a shallow trench isolation region.

20. The semiconductor device according to claim 12, wherein the isolation region is at least 2000 Å thick.

21. The semiconductor device according to claim 12, wherein the isolation region is at least 0.15 µm wide.

22. The semiconductor device of claim 12, wherein the dummy cell portion is contiguous with the memory cell portion.

* * * * *